United States Patent
Ngo et al.

(10) Patent No.: US 6,509,282 B1
(45) Date of Patent: Jan. 21, 2003

(54) SILICON-STARVED PECVD METHOD FOR METAL GATE ELECTRODE DIELECTRIC SPACER

(75) Inventors: Minh Van Ngo, Fremont, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/994,128

(22) Filed: Nov. 26, 2001

(51) Int. Cl.$^7$ .................. H01L 21/31; H01L 21/469
(52) U.S. Cl. ............................................. 438/786
(58) Field of Search ........................... 438/786, 778, 438/211, 216, 287

(56) References Cited

U.S. PATENT DOCUMENTS

| | | | |
|---|---|---|---|
| 4,954,867 A | 9/1990 | Hosaka | 357/52 |
| 5,234,541 A | 8/1993 | Shannon et al. | 156/651 |
| 5,466,617 A | 11/1995 | Shannon | 437/40 |
| 5,834,389 A | 11/1998 | Barris et al. | 501/96.5 |
| 5,930,627 A | 7/1999 | Zhou et al. | 438/257 |
| 5,946,598 A | 8/1999 | Yeh | 438/683 |
| 5,989,957 A | 11/1999 | Ngo et al. | 438/257 |
| 6,040,022 A | 3/2000 | Chang et al. | 427/579 |
| 6,051,487 A | 4/2000 | Gardner et al. | 438/585 |
| 6,066,533 A | 5/2000 | Yu | 438/275 |
| 6,096,656 A | 8/2000 | Matzke et al. | 438/702 |
| 6,100,559 A * | 8/2000 | Park | 257/315 |
| 6,107,171 A | 8/2000 | Tsai | 438/584 |
| 6,110,779 A | 8/2000 | Yang et al. | 438/257 |
| 6,162,694 A | 12/2000 | Cheek et al. | 438/305 |
| 6,187,656 B1 | 2/2001 | Lu et al. | 438/592 |
| 6,207,304 B1 * | 3/2001 | Law et al. | 428/698 |
| 6,221,794 B1 * | 4/2001 | Pangrle et al. | 438/792 |
| 6,225,168 B1 | 5/2001 | Gardner et al. | 438/287 |
| 6,245,605 B1 | 6/2001 | Hwang et al. | 438/216 |
| 6,274,421 B1 | 8/2001 | Hsu et al. | 438/233 |
| 6,291,282 B1 | 9/2001 | Wilk et al. | 438/203 |
| 2002/0052127 A1 * | 5/2002 | Gau et al. | 438/786 |

OTHER PUBLICATIONS

V.S. Nguyen; "Plasma Deposition of Silicon Nitride and Silicon Oxynitride Using Inert Carrier Gases as Transport Agents"; Extended Abstracts; vol. 83–1; pp. 216–217 (1983).

K. Takasaki et al.; "Properties of Plasma–Deposited Silicon Oxynitride Films"; Extended Abstracts; vol. 80–2; pp. 767–769 (1980).

\* cited by examiner

*Primary Examiner*—Richard Elms
*Assistant Examiner*—Beth E. Owens
(74) *Attorney, Agent, or Firm*—Renner, Otto, Boisselle & Sklar, LLP

(57) ABSTRACT

A method of making a semiconductor device including a metal gate electrode on a semiconductor substrate with a silicon oxynitride spacer formed on a surface of the metal gate electrode, wherein an interface of the silicon oxynitride spacer and the metal gate electrode is substantially free of metal silicide. The process includes steps of forming a metal gate electrode on a semiconductor substrate; forming by PECVD on a surface of the metal gate electrode a silicon oxynitride spacer, wherein the silicon oxynitride spacer is formed under initially silicon-starved conditions in which a first quantity of at least one silicon-containing material is provided to a PECVD apparatus which is reduced relative to an amount of at least one other reactant, as a result of which substantially no silicide is formed.

20 Claims, 3 Drawing Sheets

SILICON-STARVED PECVD METHOD FOR METAL GATE ELECTRODE DIELECTRIC SPACER

FIELD OF THE INVENTION

The invention relates generally to the fabrication of semiconductor devices and, more particularly, to the fabrication of a dielectric layer over a metal gate electrode in semiconductor devices.

BACKGROUND OF THE INVENTION

As electronic devices become ever more complex, the need for greater and greater numbers of transistors on the device is increased. In addition, power consumption needs to be reduced while the speed of the devices needs to be increased. In responding to these problems, the area that each transistor occupies has been reduced considerably. However, this may adversely affect one or more of the other requirements. For example, as the transistor size is scaled down, the gate structure is also scaled down and this increases the resistance of the gate. Hence, power consumption is increased and the speed of the device may be decreased.

A number of efforts to reduce the sheet resistivity of the gate structures have been made in the past. For example, at one time the polysilicon was more heavily doped with either n-type or p-type dopants. At another time, a silicide was formed in the upper portion of the gate by reaction of the polysilicon with tungsten or titanium. Later, cobalt silicide was used to reduce the resistivity of the ever smaller geometries. At the present time, metal gate electrodes have been introduced and used in a number of applications.

Metal gate electrodes provide lower sheet resistivity virtually irrespective of the width of the gate. However, many metal gate materials have problems which must be overcome before they can be implemented in a standard semiconductor processing flow. One problem is that many metals are unstable next to silicon, which is commonly used to form the gate dielectric layer, i.e., as $SiO_2$ or silicon oxynitride. Silicon oxynitride may be used for the dielectric spacer or liner formed over a metal gate electrode, due to characteristics such as forming a better barrier to migration of metal atoms, relative to $SiO_2$.

Since many metals become less conductive in the form of the respective metal silicide (formed by reaction of the metal with silicon), the benefits of metal as the gate material may be compromised or lost if a metal silicide is formed as a result of formation of the silicon oxynitride spacer. Due to the ever-smaller dimensions of the metal gate electrode, if any portion of the metal gate electrode is converted into a less-conductive metal silicide, the effectiveness of the metal gate electrode as a conductor is reduced.

Thus, a need remains for a method of forming a silicon oxynitride dielectric layer over a metal gate electrode while forming no or substantially no silicide at the interface between the metal gate electrode and the silicon oxynitride dielectric layer.

SUMMARY OF THE INVENTION

The present invention relates to a process of manufacturing a semiconductor device including a metal gate electrode, comprising providing a semiconductor substrate; forming a metal gate electrode on the semiconductor substrate; forming by PECVD on a surface of the metal gate electrode a silicon oxynitride spacer, wherein the silicon oxynitride spacer is formed under initially silicon-starved conditions in which a quantity of at least one silicon-containing material is provided to a PECVD apparatus which is reduced relative to an amount of at least one other reactant, whereby substantially no silicide is formed at an interface of the metal gate electrode and the silicon oxynitride spacer.

In another embodiment, the present invention relates to a semiconductor device including a metal gate electrode, comprising a semiconductor substrate; a metal gate electrode; and a silicon oxynitride spacer formed on a surface of the metal gate electrode, wherein an interface of the first layer and the metal gate electrode is substantially free of metal silicide.

Thus, the present invention overcomes the problem of forming a dielectric layer on a metal gate electrode without forming a metal silicide.

DETAILED DESCRIPTION

As used herein, the term "metal gate" or "metal gate electrode" refers to a gate or any other metal structure in a MOSFET or other semiconductor device formed of a metal such as Mo, Ni, Ta, Al, Co, Cu, Re, Ti or W or of a mixture or an alloy of two or more of these metals. The metal may also include one or more of TaN, TaSiN, WN, WSiN, and similar conductive nitrides of the foregoing metals. As described herein, the metal gate electrode may be formed by any method known in the art for making such structures. It should be recognized that, while the present invention is described herein in terms of a metal gate electrode, the present invention is not limited thereto, but extends to any metal structure over which a silicon oxynitride layer is to be formed in which the formation of a silicide is to be reduced or avoided.

As used herein, the term "silicon oxynitride" refers to a dielectric material containing silicon, oxygen, nitrogen, and possibly also hydrogen. The presence of absence of hydrogen depends on the conditions of formation. Silicon oxynitride may have a formula discussed in more detail below, which varies depending on a number of factors in the formation of the silicon oxynitride.

Semiconductor Devices

Figure 1:
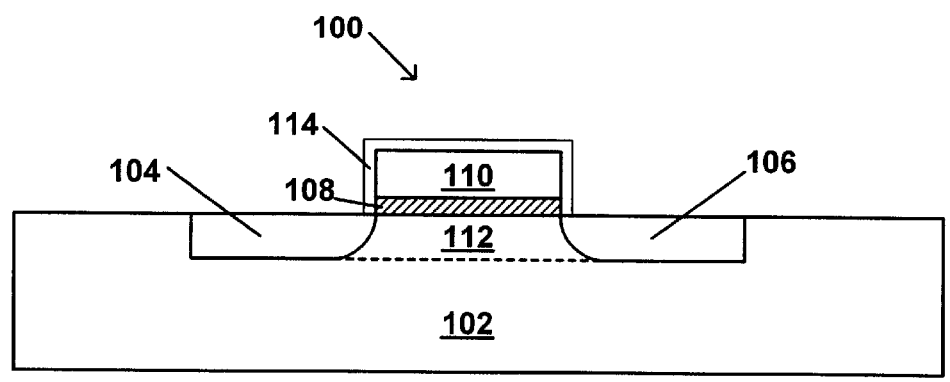
FIG. 1 is a schematic cross-sectional view of a field effect transistor including an embodiment of a metal gate electrode and a silicon oxynitride spacer in accordance with the present invention.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a metal gate electrode may be used, for example, a metal gate electrode in a FET, in a floating metal gate electrode EEPROM flash memory device, in a SONOS-type flash memory device, such as the Mirror-Bit™ SONOS-type flash memory device available from Advanced Micro Devices, Sunnyvale, Calif. Thus, it is to be understood that the present invention is not limited to the specific illustrative embodiments described below.

The present invention relates to a semiconductor device and to a process of making the semiconductor device, in which the semiconductor device includes a semiconductor substrate, a metal gate electrode and a silicon nitride spacer formed on a surface of the metal gate electrode, in which an interface formed between the metal gate electrode and the silicon oxynitride spacer is substantially free of a silicide formed by reaction of silicon from which the silicon oxynitride spacer is formed and the metal from which the metal gate electrode is formed.

Thus, in a first embodiment, the present invention relates to a semiconductor device having a metal gate electrode over which is formed a silicon oxynitride spacer. The semiconductor device includes a semiconductor substrate, a metal gate electrode and a silicon oxynitride spacer.

In one embodiment, the surface of the metal gate electrode is substantially free of a metal silicide. In another embodiment, the metal gate electrode is substantially free of a metal silicide formed by reaction of a metal of the metal gate electrode with silicon from which the silicon oxynitride spacer is formed. In another embodiment, the interface between the metal gate electrode and the silicon oxynitride spacer contains no silicide formed by reaction of a metal of the metal gate electrode with silicon from which the silicon oxynitride spacer is formed.

FIG. 1 is a schematic cross-sectional view of a MOSFET 100. The MOSFET 100 includes, for example, a p-doped silicon substrate 102, an n-doped source region 104, an n-doped drain region 106, a gate dielectric 108, a metal gate electrode 110, a channel region 112 and a silicon oxynitride spacer 114 formed on the metal gate electrode 110.

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described, but could be easily added as will be understood by those of skill in the art.

The metal of the metal gate electrode may be any metal which is known in the art for use as a metal gate electrode in a semiconductor device. In one embodiment, the metal gate electrode comprises Mo, Ni, Ta, Al, Co, Cu, Re, Ti or W or a mixture or an alloy of two or more thereof. Other metals, such as Au, Pt, Pd, Rh or Ag may be used, but these metals are expensive, so may not be economically justified for use in a semiconductor device. In another embodiment, the metal comprises one of Mo, Ni or Ta. In another embodiment, the metal is one of Mo, Ni or Ta. In one embodiment, the metal may be a conductive metal nitride such as comprising one or more of TaN, TaSiN, WN, WSiN, or other known conductive metal nitrides.

The silicon oxynitride spacer is formed of silicon oxynitride, which is known to have, in most cases, a somewhat uncertain chemical formula. Pure, stoichiometric silicon oxynitride, formed or annealed at temperatures in excess of about 1350° C., has a chemical formula $Si_2N_2O$. However, silicon oxynitride formed under conditions including, e.g., lower temperatures, or in the presence of impurities, co-reactants and non-stoichiometric amounts of reactants, generally is considered to have a chemical formula:

in which w, x, y and z represent atomic percentages of the overall formula. The amounts of oxygen and nitrogen in the formula vary depending on the above factors, and the amount of hydrogen depends on factors such as whether and in what relative amount one or more hydrogen-containing reactant is used and whether other sources of hydrogen (such as water) may be present in the reaction mixture.

Here and in all numerical values in the specification and claims, the limits of the ranges and ratios may be combined.

In the present invention, in one embodiment, the silicon oxynitride has a chemical formula

wherein:
 w is in the range of about 20 to about 56 atomic percent silicon,
 x is in the range of about 5 to about 40 atomic percent oxygen,
 y is in the range of about 10 to about 40 atomic percent nitrogen,
 z is in the range of 0 to about 10 atomic percent hydrogen, and
wherein w+x+y+z=100 atomic percent.

In semiconductor devices, it is often desired to reduce the amount of hydrogen present in a dielectric material such as silicon oxynitride. This is so because hydrogen can act as a hot carrier, and can interfere with movement of electrons in semiconductor devices. Thus, in one embodiment of the present invention, the amount of hydrogen in the silicon oxynitride spacer is reduced to a minimum. In one embodiment, in the above chemical formula for silicon oxynitride, Z is in the range from about 0.5 to about 7 atomic percent. In one embodiment, Z is in the range from about 1 to about 5 atomic percent. In another, Z is in the range from about 2 to about 4 atomic percent.

As a result of the below-described process of forming the silicon oxynitride spacer 114, the silicon oxynitride deposited under starving silicon conditions has different stoichiometry from the silicon oxynitride deposited under non-starving or stoichiometric silicon conditions. Thus, referring to the above formula, in one embodiment, the silicon oxynitride deposited under silicon-starving conditions has a silicon content in the low end of the range, i.e., from about 20 to about 30 atomic percent; the oxygen and nitrogen content is in the upper end of the ranges, i.e., from about 25 to about 40 atomic percent oxygen and from about 30 to about 40 atomic percent nitrogen; and the hydrogen content is in the lower end of the range, i.e., from about 0 to about 3 atomic percent.

In one embodiment, under non-starving silicon conditions, referring to the above formula, the deposited silicon oxynitride has a silicon content in the mid to upper end of the range, i.e., from about 40 to about 56 atomic percent; the oxygen and nitrogen content is in the low-to-middle of the ranges, i.e., from about 5 to about 25 atomic percent oxygen and from about 10 to about 25 atomic percent nitrogen. The hydrogen content may be anywhere in the range, depending on selection of conditions and reactants.

Due to the inherently variable stoichiometry of silicon oxynitride, and due to the very small thickness of the silicon oxynitride spacer 114, it may be difficult to differentiate the exact stoichiometry of the silicon oxynitride at various depths in the layer. The foregoing disclosures relating to stoichiometry are estimated, and may vary considerably. The composition of the silicon oxynitride spacer 114 may be determined to some degree of accuracy by means of X-ray photoelectron spectroscopy. X-ray photoelectron spectroscopy may be able to determine differences in composition in a layer having a thickness of several hundred angstroms.

As is known in the art, the refractive index of silicon oxynitride varies depending on the stoichiometry. Thus, in one embodiment, the portion of the silicon oxynitride spacer 114 deposited under starving silicon conditions has a refractive index in the range from about 1.6 to about 1.9. In one embodiment, the portion of the silicon oxynitride spacer 114 deposited under starving silicon conditions has a refractive index of about 1.7. In one embodiment, the portion of the silicon oxynitride spacer 114 deposited under non-starving or stoichiometric silicon conditions has a refractive index in the range from about 1.95 to about 2.3. In one embodiment, the portion of the silicon oxynitride spacer 114 deposited under non-starving or stoichiometric silicon conditions has a refractive index of about 2.1.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

Method of Making a Silicon Oxynitride Dielectric Layer in a Semiconductor Device Under Starving Silicon Conditions The present invention further relates to a method of making the above-described semiconductor device. Thus, the present invention includes a method of making a semiconductor device having a metal gate electrode and a silicon oxynitride dielectric layer thereover, in which an interface between the metal gate electrode and the dielectric layer is substantially free of a metal silicide formed by reaction of the metal of the metal gate electrode with the silicon used to form the dielectric layer.

In the present invention, silicon oxynitride is produced by a PECVD process, in which the amount of, silicon provided to the PECVD apparatus is initially a sub-stoichiometric amount. The sub-stoichiometric amount of silicon feed "starves" the reaction of silicon, so that there is no excess "free" silicon available. Avoiding excess "free" silicon avoids formation of silicides by reaction of the metal of the metal gate electrode with silicon in the silicon oxynitride-forming PECVD process. Thus, the silicon oxynitride initially formed may contain a sub-stoichiometric amount of silicon as described more fully herein. Due to the relatively "silicon starved" supply of silicon to the PECVD apparatus, formation of the initial layers of silicon oxynitride may be relatively slow.

After an initial layer of silicon oxynitride is formed on the metal gate electrode, the amount of silicon fed to the PECVD apparatus may be increased, so as to increase the rate of formation of silicon oxynitride, and to increase the amount of silicon in the silicon oxynitride layer being formed.

In one embodiment, the method of manufacturing a semiconductor device including a metal gate electrode includes the steps of providing a semiconductor substrate; forming a metal gate electrode on the semiconductor substrate; forming by PECVD on a surface of the metal gate electrode a silicon oxynitride spacer, in which the silicon oxynitride spacer is formed under initially silicon-starved conditions, in which a quantity of at least one silicon-containing material is provided to a PECVD apparatus which is reduced relative to an amount of at least one other reactant, as a result of which substantially no silicide is formed at an interface of the metal gate electrode and the silicon oxynitride spacer.

In another embodiment, the silicon-starved conditions comprise providing to a PECVD apparatus an oxygen-containing material and a nitrogen-containing material, while initially providing none of the at least one silicon-containing material, followed by providing to the PECVD apparatus a first quantity of the at least one silicon-containing material in addition to the oxygen-containing material and the nitrogen-containing material, wherein the first quantity of the at least one silicon-containing material provided contains a sub-stoichiometric amount of silicon, in relation to the oxygen-containing material and the nitrogen-containing material, for PECVD deposition of silicon oxynitride.

Additional details of the method of a method in accordance with the present invention are set forth below. The specific examples provided herein are intended to explain the invention, but are not intended to limit the scope of the invention, which is defined by the attached claims.

Figure 2:
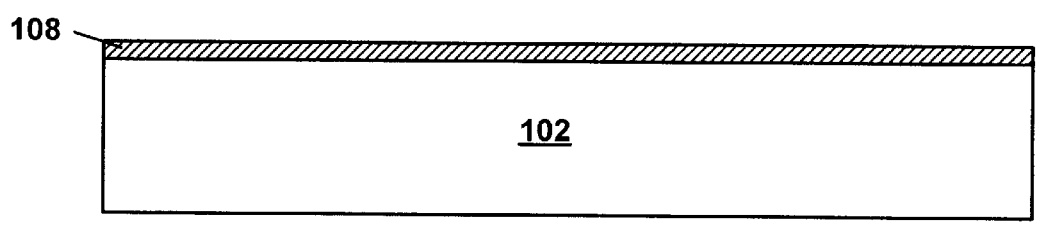
FIG. 2 is a schematic cross-sectional view of a semiconductor substrate with a gate dielectric layer applied thereto in accordance with an embodiment of the present invention.
Figure 6:
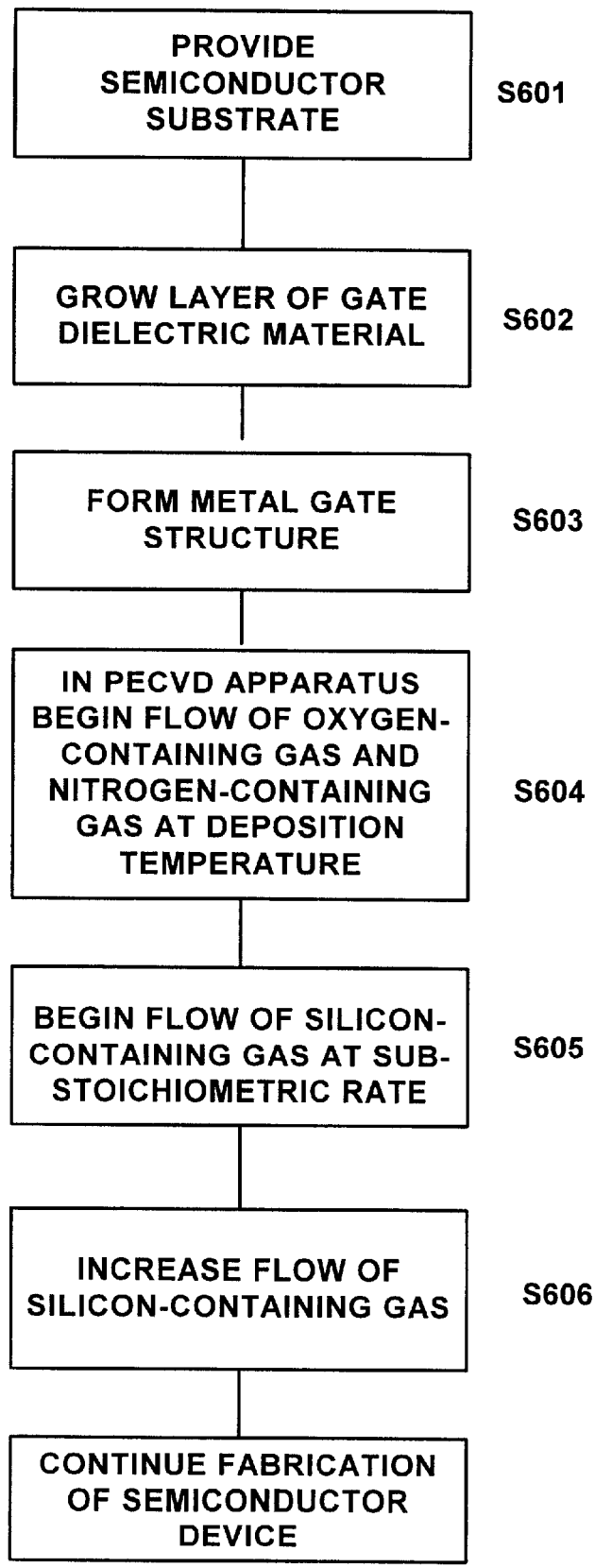
FIG. 6 is a schematic flow diagram showing the basic steps in a process of making a semiconductor device in accordance with the present invention.

In the first step of the method of the present invention, shown in FIG. 6 as Step S601, a semiconductor substrate 102 is provided, as shown in, e.g., FIG. 2. The semiconductor substrate may be any appropriately selected semiconductor substrate known in the art, as described above.

In the second step of the method of the present invention, shown in FIG. 6 as Step S602, a gate dielectric layer 108 is grown on the surface of the semiconductor substrate 102. The gate dielectric layer 108 may be grown by any method known in the art, and may include any material which is appropriate for use with a metal gate electrode on a semiconductor device. The gate dielectric layer 108 may comprise silicon dioxide, silicon nitride, silicon oxynitride, any one of a variety of known high-K dielectric materials, such as hafnium oxide, yttrium oxide, lanthanum oxide, and combinations of such dielectric materials, such as hafnium silicate. Suitable high-K dielectric materials are disclosed in copending, commonly assigned U.S. patent application Ser. No. 09/977,928, filed Oct. 15, 2001, and in copending, commonly assigned U.S. patent application Ser. No. 09/977,922, filed Oct. 15, 2001. The disclosures of both of these applications are incorporated herein by reference for their teachings relating to high-K dielectric materials.

The gate dielectric layer 108 may include a plurality of layers, such as silicon dioxide and silicon nitride, or an "ONO" layer, of silicon dioxide, silicon nitride and silicon dioxide sandwich, in, e.g., a SONOS-type device, such as that available under the trade name MIRROR-BIT™ from Advanced Micro Devices, Inc., Sunnyvale, Calif. Where the gate is a metal gate electrode, such a device may be referred as a MONOS-type device.

FIG. 2 shows the nascent semiconductor device 100 after application of a gate dielectric layer or layers, i.e., at the completion of step S602. Although only a single dielectric layer 108 is shown in FIG. 2, it is understood, as mentioned above, that multiple layers may be included in the gate dielectric layer 108.

In the third step of the method of the present invention, shown in FIG. 6 as Step S603, a metal gate electrode 110 is formed. In the embodiment shown in FIG. 3, the metal gate electrode is formed by applying a metal layer 110 of a suitable metal on the surface of the substrate. Portions of the metal layer 110 will subsequently be etched away, to form the metal gate electrode 110 shown in FIG. 4.

In one embodiment, the metal is one of the metals set forth above, or a mixture or an alloy of two or more of those metals, or a nitride of such metals, mixtures or alloys.

In one embodiment, the metal gate electrode 110 may be formed by a method such as that described in U.S. Pat. No. 6,066,533. The method described therein forms a metal gate electrode by forming gate voids in a field oxide, and thereafter filling the gate voids with a metallic gate electrode material. The disclosure of U.S. Pat. No. 6,066,533 relating to forming a metal gate electrode is hereby incorporated herein by reference.

In one embodiment, the metal gate electrode 110 may be formed by a method such as that described in U.S. Pat. No. 6,225,168. The method described therein forms a gate dielectric layer over a substrate; forms a titanium or tantalum nitride barrier layer over the gate dielectric layer; and forms a metal gate electrode over the titanium or tantalum nitride barrier layer. The process may further include forming nitrogen bearing spacers adjacent sidewalls of the metal gate electrode such that the spacers and the barrier layer seal the gate dielectric layer against the substrate. In one embodiment, the process of the '168 patent includes forming a metal layer on the underlying gate dielectric layer and barrier layer. Portions of the metal layer and underlying gate and barrier layers are removed, e.g., by photolithography and etching techniques, to form the metal gate electrode.

In another embodiment, the process of the '168 patent includes forming a metal gate electrode by use of a sacrificial plug. As disclosed therein, use of a sacrificial plug allows for the formation of metal gate electrodes using temperature-sensitive metals. This method is more fully described in U.S. Pat. No. 6,051,487. The disclosures of U.S. Pat. Nos. 6,225,168 and 6,051,487 relating to forming a metal gate electrode are hereby incorporated herein by reference.

In another embodiment, the metal gate electrode may be formed by a process such as that described in U.S. Pat. No. 6,162,694. The process of this patent forms a polysilicon alignment structure, uses this structure in forming certain components of a semiconductor device, then removes and replaces the polysilicon alignment structure with a metal to form a metal gate electrode. The disclosure of U.S. Pat. No. 6,162,694 relating to forming a metal gate electrode is hereby incorporated herein by reference.

The foregoing processes for forming the metal gate electrode are merely exemplary, and are not intended to limit the scope of the present invention. The metal gate electrode of the present invention may be made by any suitable process known in the art for formation of a metal gate electrode.

Figure 3:
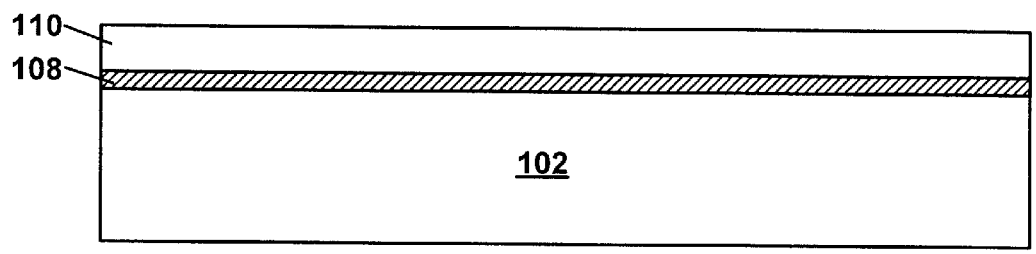
FIG. 3 is a schematic cross-sectional view of a semiconductor substrate with a metal gate-forming layer applied thereto in accordance with an embodiment of the present invention.

FIG. 3 shows the nascent semiconductor device 100 after application of a metal gate layer 110 over the gate dielectric layer 108, i.e., at the completion of step S603, in an embodiment in which the metal gate layer 110 is formed as a layer.

Figure 4:
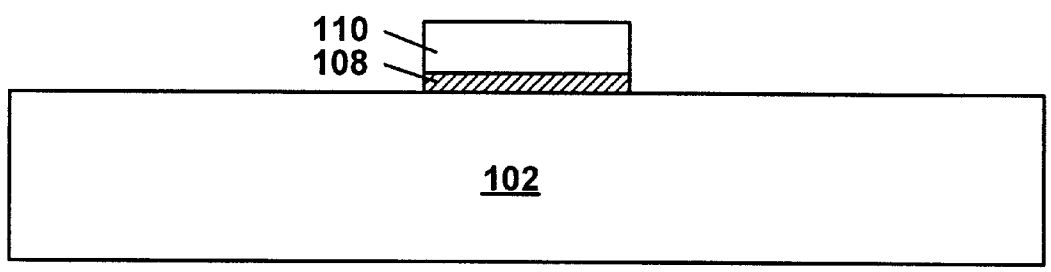
FIG. 4 is a schematic cross-sectional view of a semiconductor substrate following removal of portions of the metal gate-forming layer and of the gate dielectric layer to form a metal gate electrode, in accordance with an embodiment of the present invention.

FIG. 4 shows the nascent semiconductor device 100 after the metal gate layer and the underlying gate dielectric layer have been etched back to form a metal gate electrode 110. Alternatively, FIG. 4 shows the nascent semiconductor device 100 after the metal gate electrode 110 has been formed by one of the alternative methods described above, after the gate-forming structures (such as a silicon dioxide layer) have been removed.

The next steps of the process of the present invention, shown in FIG. 6 as Steps S604, S605 and S606, are carried out in a PECVD apparatus. In one embodiment, these steps are carried out in a CVD apparatus, by a standard CVD process. After the metal gate electrode 110 has been formed on the nascent semiconductor device 100, as shown in FIG. 4, the device 100 (or, more generally, the wafer upon which the device 100 is formed) is placed in an appropriate PECVD apparatus. In one embodiment, the metal gate layer is formed in the same PECVD apparatus in which the silicon oxynitride layer is formed, so the wafer need not be moved. In one embodiment, the gate dielectric layer 108, the metal gate layer 110, and the silicon oxynitride layer 114 are all formed in the same PECVD apparatus.

As shown in FIG. 6, in Step S604, with the nascent semiconductor device 100 in the PECVD apparatus, at the appropriate temperature, a flow of oxygen-containing gas and a flow of nitrogen containing gas are provided to the apparatus. This step S604 sets up the PECVD conditions, except for the presence of a silicon-containing gas. Since at this point there is no silicon source available for a PECVD reaction, no silicon oxynitride-formation reaction takes place. However, since the conditions are quite reactive, i.e., a flow of a strong oxidant at an elevated temperature, the conditions of Step S604 are maintained for about 10 to about 20 seconds, and in one embodiment for about 15 seconds. In one embodiment, the PECVD apparatus is evacuated to a pressure of about 2 Torr prior to commencement of the flows of the oxygen- and nitrogen-containing gases.

In one embodiment, the PECVD process is carried out at a temperature in the range from about 300° C. to about 600° C.

In one embodiment, the oxygen-containing gas is nitrous oxide, $N_2O$. In another embodiment, the oxygen-containing gas is oxygen, $O_2$.

In one embodiment, the nitrogen-containing gas is nitrogen, $N_2$. Nitrogen is advantageous since it also functions as a carrier gas in the PECVD apparatus, thereby obviating the need for an additional separate carrier gas. In another embodiment, a nitrogen-containing gas other than nitrogen may be used, as known in the art. Such gas may include for example, nitric oxide, NO.

In one embodiment, the nitrogen-containing gas is not ammonia. Ammonia is disfavored because of its hydrogen content, which contributes unfavorably to the hydrogen content of the silicon oxynitride.

Figure 5:
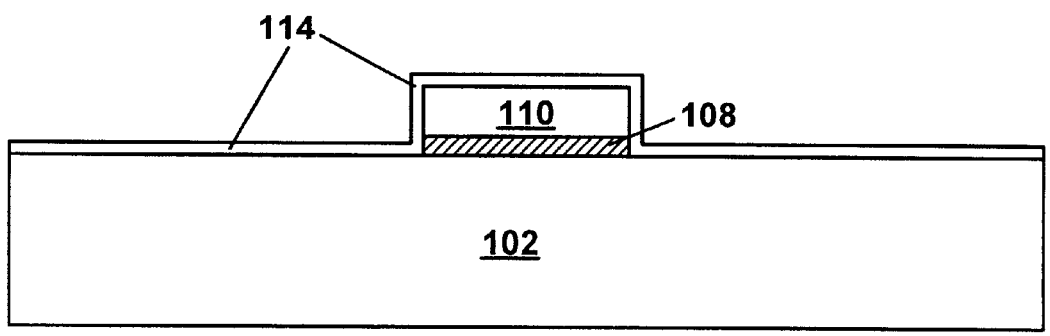
FIG. 5 is a schematic cross-sectional view of a semiconductor substrate with a silicon oxynitride layer applied thereto in accordance with an embodiment of the present invention.

As shown in FIG. 6, in the next step, S605, a flow of a first quantity of a silicon-containing gas is started to the PECVD apparatus. In one embodiment, Step S605 commences when Step S604 is completed. In another embodiment, Step S605 commences with no substantial delay after the completion of Step S604. The flow of silicon-containing gas results in initiation of the formation of the silicon oxynitride spacer layer 114, as shown in FIG. 5.

The flow of silicon-containing gas provided to the PECVD apparatus in Step S605 is substantially less than a stoichiometric amount based on the flows of either or both of the oxygen-containing gas and the nitrogen-containing gas. The purpose of initially limited the flow of silicon-containing gas is to prevent the existence of an excess of silicon in the PECVD reaction mixture and to thereby avoid the formation of metal silicides. If the flow of silicon-containing gas is initially provided near, at or above the stoichiometric amount, metal silicides may form either on the surface of the metal gate electrode or at an interface between the metal gate electrode and the silicon oxynitride spacer 114. By providing a sub-stoichiometric quantity of silicon, in relation to the quantity of the oxygen- and nitrogen-containing gases, substantially no silicides are formed on the surface of the metal gate electrode 110 or at the interface between the metal gate electrode 110 and the silicon oxynitride spacer 114. Such metal silicide would be formed by a reaction between the metal of the metal gate electrode 110 and the silicon provided to the PECVD apparatus in the silicon-containing gas, if the initial amount of available, free silicon is greater.

Since the quantity of silicon-containing gas which is provided to the PECVD reaction in Step S605 is quite limited, the rate of formation of the silicon oxynitride layer 114 is low during this step. For example, in the initial stage of formation of this layer, during Step S605, the deposition rate of silicon oxynitride may be in the range from about 5 to about 50 Å per second, and in one embodiment, about 25 Å per second. This rate would not be considered economical for formation of a layer of SiON to a thickness of, e.g., 300 to 1000 Å.

In one embodiment, the silicon-containing gas is silane, $SiH_4$. In another embodiment, the silicon-containing gas is dichlorosilane. While a silicon-containing material such as TEOS may be used, the high level of hydrogen in this material would not be favored, when it is desired to maintain a low level of hydrogen in the silicon oxynitride spacer 114 formed by the PECVD process.

As shown in FIG. 6, in the next step, S606, a flow of a silicon-containing gas to the PECVD apparatus is increased from the quantity provided in Step S605. In one embodiment, Step S606 commences when Step S605 is completed. In another embodiment, Step S606 commences with substantially no delay after completion of Step S605. The flow of silicon-containing gas results in further formation of the silicon oxynitride spacer layer 114, as shown in FIG. 5. In one embodiment, the flow of silicon-containing gas continues during step S606 for a period in the range from about 2 seconds to about 20 seconds. In one embodiment, the period is in the range from about 3 seconds to about 10 seconds.

Due to the increased flow of silicon-containing gas, the rate of silicon oxynitride formation is increased. In one embodiment, the rate is dramatically increased. For example, in this stage of formation of this layer, during Step S606, the deposition rate of silicon oxynitride may be increased into the range from about 100 to about 150 Å per second, and in one embodiment, about 125 Å per second. This rate would be considered economical for formation of a layer of SiON to a thickness of, e.g., 300 to 1000 Å.

In one embodiment, the flow of silicon-containing gas is continued until a layer of silicon oxynitride ranging from about 200 Å to about 1000 Å thick is deposited. In another embodiment, the thickness ranges from about 250 Å to about 750 Å. In another embodiment, the thickness ranges from about 300 Å to about 600 Å, and in another, about 400 Å.

In one embodiment, the silicon-starved portion of the silicon oxynitride spacer 114 comprises from about 25% to about 40%, and in one embodiment about 33% of the total thickness of the silicon oxynitride spacer 114. As noted above, the silicon-starved portion of the silicon oxynitride spacer 114 can be differentiated from the remainder of the spacer 114 based on one or both of X-ray photoelectron spectroscopy determinations or on determination of the refractive index of the silicon oxynitride.

Following deposition of the silicon oxynitride spacer layer 114, in one embodiment, the portions of the layer 114 extending beyond the metal gate electrode 110 are removed to form the silicon oxynitride spacer 114 shown in FIG. 1. In one embodiment, the portions of the layer 114 are removed by use of suitable photolithography, masking and etching steps. Other methods known in the art may of course be used for removal of these portions of the silicon oxynitride layer 114.

At any selected and appropriate point during the formation of the metal gate electrode 110 and the silicon oxynitride spacer 114, the nascent semiconductor device 100 may be subjected to appropriate implantation processes for formation of the source and drain 104, 106 shown in FIG. 1. In one embodiment, the implantation may be carried out subsequent to formation of the metal gate electrode 110, but prior to deposition of the silicon oxynitride spacer 114. In another embodiment, the implantation may be carried out subsequent to both formation of the metal gate electrode 110 and deposition of the silicon oxynitride layer 114. In another embodiment, the implantation may be carried out subsequent to removal of the excess portions of the silicon oxynitride layer 114, from which the silicon oxynitride spacer 114 of FIG. 1 is obtained.

Upon completion of the formation of the metal gate electrode 110, the silicon oxynitride spacer 114 and the source and drain 104, 106, the semiconductor device 100 shown in FIG. 1 is obtained. Thereafter, the semiconductor device 100 may be further processed as appropriate to the fabrication scheme of which the process of the present invention is a part.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process of manufacturing a semiconductor device including a metal gate electrode, comprising:

providing a semiconductor substrate;

forming a metal gate electrode on the semiconductor substrate;

forming by PECVD on a surface of the metal gate electrode a silicon oxynitride spacer, wherein the silicon oxynitride spacer is formed under initially silicon-starved conditions in which a first quantity of at least one silicon-containing material is provided to a PECVD apparatus which is reduced relative to an amount of at least one other reactant, whereby substantially no silicide is formed at an interface of the metal gate electrode and the silicon oxynitride spacer.

2. A process as in claim 1, wherein the step of forming by PECVD further comprises providing a second, increased quantity of the at least one silicon-containing material provided.

3. A process as in claim 1, wherein the silicon-starved conditions comprise providing to a PECVD apparatus an oxygen-containing material and a nitrogen-containing material while initially providing none of the at least one silicon-containing material, followed by providing to the PECVD apparatus the first quantity of the at least one silicon-containing material in addition to the oxygen-containing material and the nitrogen-containing material, wherein the first quantity of the at least one silicon-containing material provided contains a sub-stoichiometric amount of silicon, in relation to the oxygen-containing material and the nitrogen-containing material, for PECVD deposition of silicon oxynitride.

4. A process as in claim 1, wherein substantially no metal silicide is formed on the surface of the metal gate electrode.

5. A process as in claim 1, wherein the PECVD process is carried out at a temperature in the range from about 300° C. to about 600° C.

6. A process as in claim 1, wherein the oxygen-containing material is nitrous oxide ($N_2O$).

7. A process as in claim 1, wherein the nitrogen-containing material is nitrogen ($N_2$).

8. A process as in claim 1, wherein the at least one silicon-containing material is silane ($SiH_4$).

9. A process as in claim 1, wherein the metal gate electrode comprises Mo, Ni, Ta, Al, Co, Cu, Re, Ti or W or a mixture or an alloy of two or more thereof, or of a conductive metal nitride comprising one or more of TaN, TaSiN, WN, WSiN.

10. A process as in claim 1, wherein the dielectric spacer is a silicon oxynitride spacer.

11. A process as in claim 10, wherein a first portion of the silicon oxynitride spacer has a refractive index in the range from about 1.6 to about 1.9, and a second portion has a refractive index in the range from about 1.95 to about 2.3.

12. A process of manufacturing a semiconductor device including a metal gate electrode, comprising:
providing a semiconductor substrate;
forming a metal gate electrode on the semiconductor substrate; and
forming a substantially silicide-free dielectric spacer on a surface of the metal gate electrode in a PECVD apparatus by providing to the PECVD apparatus an oxygen-containing material and a nitrogen-containing material in the absence of a silicon-containing material, followed by providing to the PECVD apparatus a first quantity of at least one silicon-containing material in addition to the oxygen-containing material and the nitrogen-containing material, wherein the first quantity of the at least one silicon-containing material provided contains a sub-stoichiometric amount of silicon, in relation to the oxygen-containing material and the nitrogen-containing material, for PECVD deposition of silicon oxynitride.

13. A process as in claim 12, further comprising a step of providing to the PECVD apparatus a second, increased quantity of the at least one silicon-containing material relative to the first quantity of the silicon-containing material.

14. A process as in claim 12, wherein the second quantity of the at least one silicon-containing material comprises a substantially stoichiometric quantity of silicon for formation of silicon oxynitride.

15. A process as in claim 12, wherein substantially no metal silicide is formed on the surface of the metal gate electrode.

16. A process of manufacturing a semiconductor device including a metal gate electrode, comprising:
providing a semiconductor substrate;
forming a metal gate electrode on the semiconductor substrate; and
forming a substantially silicide-free dielectric spacer on a surface of the metal gate electrode in a PECVD apparatus by (a) providing to the PECVD apparatus an oxygen-containing material and a nitrogen-containing material in the absence of a silicon-containing material, followed by providing to the PECVD apparatus a first quantity of at least one silicon-containing material in addition to the oxygen-containing material and the nitrogen-containing material, wherein the first quantity of the at least one silicon-containing material provided contains a sub-stoichiometric amount of silicon, in relation to the oxygen-containing material and the nitrogen-containing material, for PECVD deposition of silicon oxynitride and thereafter (b) providing to the PECVD apparatus a second, increased quantity of the at least one silicon-containing material relative to the first quantity of the silicon-containing material, wherein substantially no metal silicide is formed on the surface of the metal gate electrode.

17. A process as in claim 16, wherein the second quantity of the at least one silicon-containing material comprises a substantially stoichiometric quantity of silicon for formation of silicon oxynitride.

18. A process as in claim 16, wherein the PECVD process is carried out at a temperature in the range from about 300° C. to about 600° C.

19. A process as in claim 16, wherein the oxygen-containing material is nitrous oxide ($N_2O$).

20. A process as in claim 16, wherein the nitrogen-containing material is nitrogen ($N_2$).

* * * * *